United States Patent
Haba et al.

(10) Patent No.: US 6,940,158 B2
(45) Date of Patent: Sep. 6, 2005

(54) ASSEMBLIES HAVING STACKED SEMICONDUCTOR CHIPS AND METHODS OF MAKING SAME

(75) Inventors: Belgacem Haba, Cupertino, CA (US); Masud Beroz, Livermore, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 10/448,515

(22) Filed: May 30, 2003

(65) Prior Publication Data

US 2004/0238931 A1 Dec. 2, 2004

(51) Int. Cl.⁷ .................. H01L 23/02; H01L 23/48; H01L 23/52
(52) U.S. Cl. .................. 257/686; 257/778; 257/738; 257/780; 257/692; 257/702; 257/783
(58) Field of Search ................. 257/686, 778, 257/780, 737, 738, 702, 692, 783, 723, 701

(56) References Cited

U.S. PATENT DOCUMENTS

| | | | |
|---|---|---|---|
| 3,766,438 A | * 10/1973 | Isaacson ................. 361/714 |
| 4,941,033 A | 7/1990 | Kishida |
| 5,148,265 A | 9/1992 | Khandros et al. |
| 5,148,266 A | 9/1992 | Khandros et al. |
| 5,347,159 A | 9/1994 | Khandros et al. |
| 5,448,511 A | * 9/1995 | Paurus et al. ................. 365/52 |
| 5,679,977 A | 10/1997 | Khandros et al. |
| 5,776,797 A | * 7/1998 | Nicewarner et al. ......... 438/107 |
| 5,980,270 A | 11/1999 | Fjelstad et al. |
| 6,121,676 A | 9/2000 | Solberg |
| 6,225,688 B1 | 5/2001 | Kim et al. |
| 6,300,679 B1 | 10/2001 | Mukerji et al. |
| 2004/0238936 A1 | * 12/2004 | Rumer et al. ................ 257/688 |

OTHER PUBLICATIONS

Fjelstad, U.S. Appl. No. 10/077,388, filed Feb. 15, 2002.
Kang et al., U.S. Appl. No. 10/655,952, filed Sep. 5, 2003.
Kang et al., U.S. Provisional Appl. No. 60/409,880, filed Sep. 11, 2002.
Kim et al., U.S. Appl. No. 09/776,356, filed Feb. 2, 2001.

* cited by examiner

*Primary Examiner*—Nitin Parekh
(74) *Attorney, Agent, or Firm*—Lerner, David, Littenberg, Krumholz & Mentlik, LLP

(57) ABSTRACT

A stacked microelectronic assembly comprises a flexible sheet having an obverse surface and a reverse surface and including at least a first panel and a second panel. The second panel and the first panel are adjacent to each other, the second panel including terminals on the reverse surface for mounting to an external circuit. The first panel includes a non-overmolded microelectronic element mounted thereon. The microelectronic element having a rear face and a front face surface, wherein the front face surface confronts the obverse surface of the first panel. During manufacture the flexible sheet is folded to create a stacked microelectronic assembly such that the rear face of the first microelectronic assembly confronts and substantially contacts the obverse surface of the second panel. This results in the second panel being kept substantially flat during subsequent mounting to the external circuit.

18 Claims, 8 Drawing Sheets

ASSEMBLIES HAVING STACKED SEMICONDUCTOR CHIPS AND METHODS OF MAKING SAME

BACKGROUND OF THE INVENTION

The present invention relates to stacked microelectronic assemblies and methods of making such assemblies, to methods of forming such assemblies and to components useful in such assemblies.

Semiconductor chips are commonly provided as individual, prepackaged units. A standard chip has a flat, rectangular body with a large front face having contacts connected to the internal circuitry of the chip. Each individual chip is mounted in a package, which in turn is mounted on a circuit panel, such as a printed circuit board, and which connects the contacts of the chip to conductors on the circuit panel. In many conventional designs, the chip package occupies an area of the circuit panel considerably larger than the area of the chip itself. As used in this disclosure, with reference to a flat chip having a front face, the "area of the chip" should be understood as referring to the area of the front face. In "flip-chip" designs, the front face of the chip confronts the face of the circuit panel, and the contacts on the chip are bonded directly to the circuit panel by solder balls or other connecting elements. The "flip-chip" design provides a relatively compact planar arrangement; each chip occupies an area of the circuit panel equal to or slightly larger than the area of the chip front face. However, this approach suffers from cost and reliability problems. As disclosed, for example, in certain embodiments of commonly assigned U.S. Pat. Nos. 5,148,265, 5,148,266 and 5,679,977, the disclosures of which are incorporated herein by reference, certain innovative mounting techniques offer compactness approaching or equal to that of conventional flip-chip bonding without the reliability and testing problems commonly encountered in that approach. A package which can accommodate a single chip in an area of the circuit panel equal to or slightly larger than the area of the chip itself is commonly referred to as a "chip-size package."

Various proposals have been advanced for providing multiple chips in a single package or module. In a conventional "multi-chip module", the chips are mounted side-by-side on a single package substrate, which in turn can be mounted to the circuit panel. This approach offers only limited reduction in the aggregate area of the circuit panel occupied by the chips. The aggregate area is still greater than the total surface area of the individual chips in the module. It has also been proposed to package multiple chips in a "stacked" arrangement, i.e., an arrangement where chips are placed one on top of another. In a stacked arrangement, several chips can be mounted in an area of the circuit panel that is less than the total area of the chips. Certain stacked chip arrangements are disclosed, for example, in certain embodiments of the aforementioned '977 and '265 patents and in U.S. Pat. No. 5,347,159, the disclosure of which is incorporated herein by reference. U.S. Pat. No. 4,941,033, also incorporated herein by reference, discloses an arrangement in which chips are stacked one on top of another and interconnected with one another by conductors on so-called "wiring films" associated with the chips.

Another approach is presented in commonly assigned U.S. Pat. Nos. 6,121,676 and 6,225,688 and U.S. patent application Ser. No. 09/776,356 filed Feb. 2, 2001, the disclosures of which are incorporated herein by reference. Certain preferred embodiments of the stacked microelectronic assemblies disclosed in these patents and application include an elongated, tape-like flexible substrate having terminals for connection to an external circuit and having a plurality of chips distributed along the axis of elongation of the substrate and attached thereto. The flexible substrate is folded so as to stack the chips in substantially vertical alignment with one another in a serpentine fashion resulting in a "serpentine-type folded stack." While folded stack assemblies, or packages, according to these embodiments provide useful improvements, still further improvements would be desirable. In these assemblies, the individual chips are connected to the terminals and to each other by traces extending generally lengthwise along the elongated substrate. The lengths of the traces connecting the various chips to the terminals may differ from one another. Thus, the chip furthest from the terminals along the length of the substrate is connected to the terminals by relatively long traces, whereas the chip closest to the terminals is connected to the terminals by shorter traces. As the delay in signal propagation along the traces varies with the length of the traces, such delays increase as the number of chips distributed along the axis of the flexible substrate is increased.

The co-pending, commonly assigned, U.S. patent application Ser. No. 10/077,388, filed Feb. 15, 2002, the disclosure of which is incorporated by reference herein, provides some improvements to folded stack packages. In particular, a tape-like flexible substrate includes side panels disposed around a core panel, which has terminals for connection to an external circuit. Illustratively, each side panel includes one, or more, individual chips attached thereto. The flexible substrate is folded such that each of the side panels is folded over the core panel so as to stack the chips in substantially vertical alignment with one another resulting in a "side-panel-type folded stack." In this type of folded stack package, the lengths of the traces connecting the various chips on each of the side panels to the terminals of the core panel is substantially the same. Thus, the delay in signal propagation to the chips mounted on the various side panels is substantially the same.

However, still further improvements in stacked chip assemblies would be desirable. In particular, during the mounting of a folded stack package to an external circuit, or circuit board, the terminals of a folded stack package are attached to the circuit board by conductive masses, e.g., solder. Unfortunately, the portion of the flexible substrate with the terminals may "bubble," i.e., the flexible tape confronting the circuit board may not lie flat during assembly. Consequently, during mounting of the flexible stacked package to the circuit board, the terminals of the flexible substrate may either not bond to the external circuit thereby resulting in "opens" and requiring re-work of the assembly, or poor connections may result yielding subsequent poor and/or unreliable circuit performance.

SUMMARY OF THE INVENTION

One aspect of the present invention provides a stacked microelectronic assembly wherein the microelectronic elements of the assembly are attached to a single continuous sheet that is folded so that a rear face of one of the microelectronic elements confronts and substantially contacts that portion of an obverse surface of the single continuous sheet that includes terminals on a reverse surface of the sheet for mounting to an external circuit, i.e., the terminal portion of the sheet. The confronting rear face of the microelectronic element with the obverse surface of the terminal portion advantageously keeps the terminal portion substantially flat during attachment of the stacked assembly to the external circuit.

In one illustrative embodiment, a stacked microelectronic assembly includes a continuous flexible sheet having oppositely-directed obverse and reverse surfaces, the sheet including at least a first panel and a second panel and having a folding portion connecting the first panel and the second panel to each other. Terminals are exposed at the reverse surface of the second panel for mounting to an external circuit and there are one or more wiring layers including traces extending along the sheet between the panels by way of the folded portion, at least some of the traces electrically connecting a first microelectronic element to at least some of the terminals. The first microelectronic element has a front face surface and an opposite rear face and is mounted on the obverse surface of the first panel wherein the front face surface confronts the obverse surface of the sheet. The sheet is folded to form a folded stack such that the second panel is either at the top, or the bottom, of the stack and such that a substantial area of the rear face of the first microelectronic element overlies and makes contact with the obverse surface of the second panel, thus keeping the second panel substantially flat.

Another aspect of the invention relates to a method of making stacked electronic assemblies of the type described herein using a substrate in the form of a flat sheet.

In one illustrative embodiment, the steps of making a stacked electronic assembly include providing a substrate in the form of a flexible sheet having oppositely-directed obverse and reverse surfaces and a wiring layer, the sheet including at least a first panel and a second panel and having a folding portion connecting the first panel and the second panel to each other, the second panel of the sheet including terminals on the reverse surface for mounting the sheet to an external circuit, the wiring layer comprising traces extending along the sheet and being electrically connected to the terminals; assembling at least a first microelectronic element on the obverse surface of the first panel for electrically connecting the at least first microelectronic element to the traces, the first microelectronic element having a front face and an opposite rear face; and folding the sheet about the folding portion so as to stack the at least first microelectronic element over the second panel such that the rear face of the first microelectronic element closely confronts the obverse surface of the second panel, whereby the second panel is kept substantially flat. Illustrative forms of the stacked microelectronic assembly include, but are not limited to, a serpentine-type folded stack and a side-panel-type folded stack.

DETAILED DESCRIPTION

Figure 1:
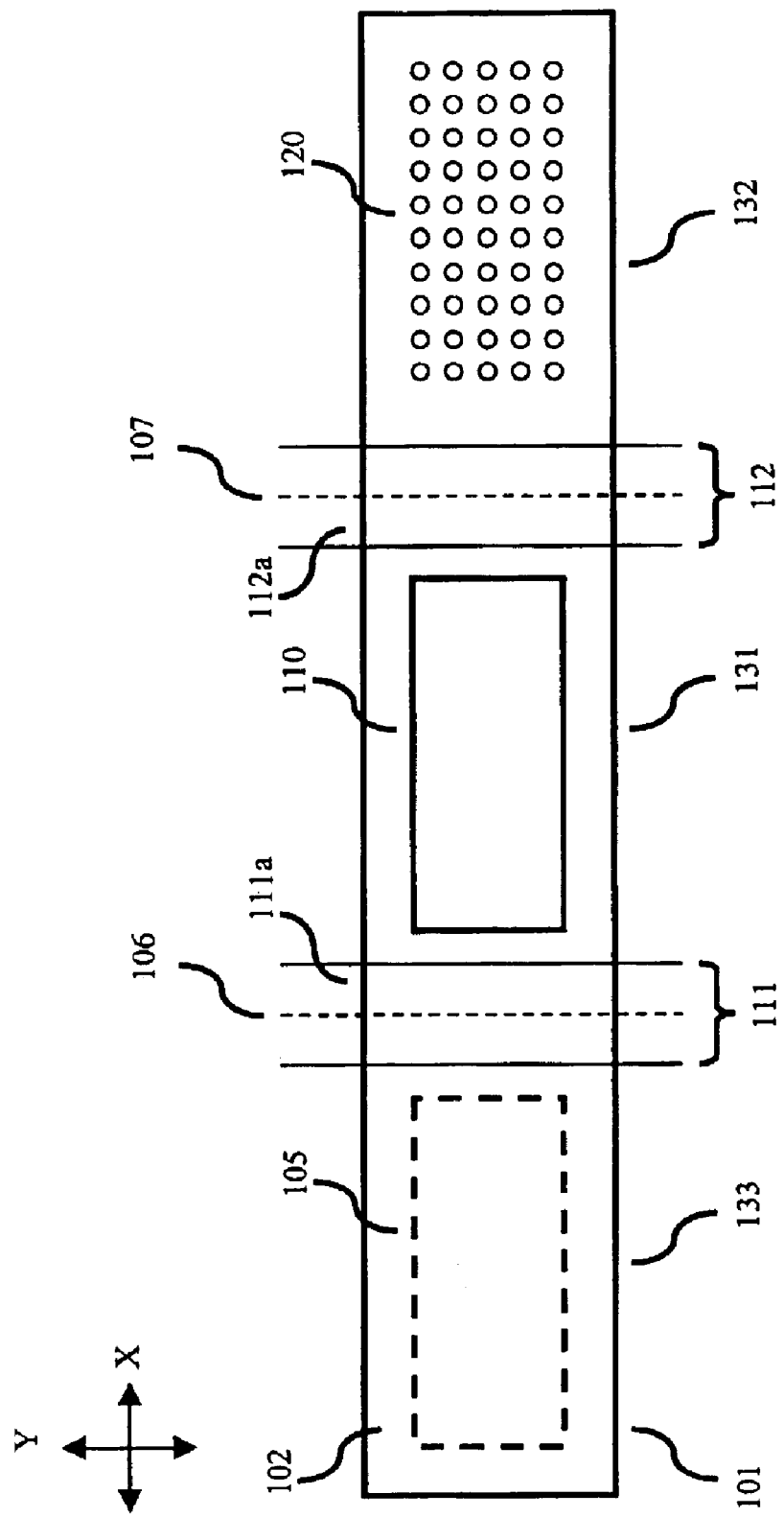
FIG. 1 is an illustrative diagrammatic plan view of a component according to one embodiment of the invention.
Figure 2:
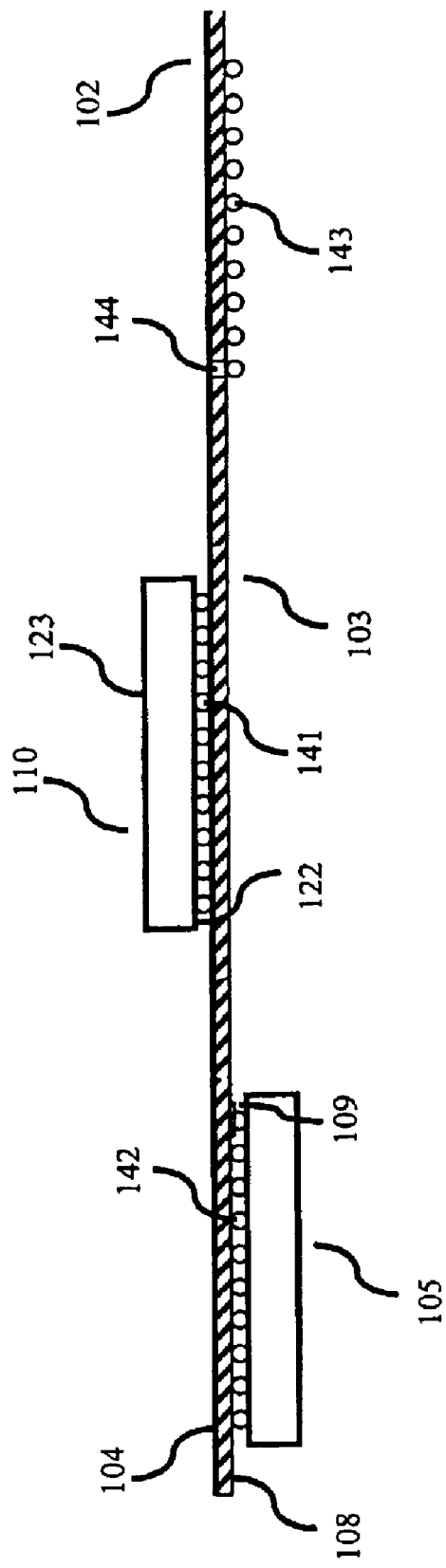
FIG. 2 is an illustrative side view of the component of FIG. 1.

An illustrative assembly in accordance with one embodiment of the invention includes a component in the form of a unitary sheet 101 as shown in FIGS. 1 and 2. It should be noted that the dimensions of the assemblies shown in the figures are greatly exaggerated for clarity of illustration and like numbers represent similar elements.

The sheet has a first or obverse side 102 (the side visible in FIG. 1) and an oppositely directed reverse side 103 (FIG. 2). The sheet 101 is of generally rectangular shape as seen in plan view, and includes a first panel 131, a second panel 132 and a third panel 133. Between the first panel 131 and the second panel 132 is fold axis 107, while fold axis 106 is between the first panel 131 and the third panel 133. Although each panel is illustratively shown as a rectangular shape, this is not required and other shapes may be used. Sheet 101 includes fold regions 111 and 112 associated with fold axis 106 and fold axis 107, respectively. In this example, the fold regions have approximately the same length. A portion of each fold region is located on a particular panel. For example, fold region 111 includes fold region 111a on first panel 131. Similarly, fold region 112 includes fold region 112a located on first panel 131. As described herein, the "length" of each panel and fold region refers to the dimension of the panel or fold region in the x-dimension as shown on FIG. 1 or perpendicular to fold axis 106 (or, for that matter, fold axis 107). For example, the length of the first panel 131 and the length of the fold region 111a are the dimensions of these features perpendicular to fold axis 106.

The sheet includes a layer of a dielectric 108 with a metallization layer 104 (FIG. 2) disposed on the obverse side of layer 108. The metallization layer 104 defines terminals 120 on second panel 132 and traces extending from the terminals outwardly along the length of sheet 101. Terminals 120 are exposed at the reverse surface 103 of the dielectric layer through holes 144 in the dielectric layer. As used herein, a terminal or other conductive feature can be considered "exposed at" a surface of a dielectric layer if the metallic feature is accessible to a contact or bonding material applied to such surface. Thus, a metallic feature which projects from the surface of the dielectric, or which is flush with the surface of the dielectric, is "exposed at" such surface, and a feature recessed from the surface but aligned with an opening in the dielectric extending to the surface is also "exposed at" such surface. The particular layout of traces is not relevant to the inventive concept. Merely by way of example, where the assembly includes memory chips, these traces typically provide conductive paths for unique signals (e.g., a chip select signal), common signals (e.g., address, data), as well as power and ground paths. For simplicity, individual traces are not shown in the figures.

Sheet 101 has mounted thereon two microelectronic elements 105 and 110. In FIG. 1, microelectronic element 105 is shown in broken line form as this element is mounted in panel 133 to the reverse side of sheet 101 as illustrated in FIG. 2. Microelectronic element 110 is mounted in panel 131 to the obverse side of sheet 101. Both microelectronic elements are illustratively non-overmolded chips or dies and are flip-chip bonded to the respective surfaces of sheet 101. For example, as shown in FIG. 2, front face surface 122 of microelectronic element 110 confronts obverse surface 102 of sheet 101. The contacts (not shown) of microelectronic element 110 are bonded to bond pads (not shown) of the metallization layer 104 via solder balls 141. Similarly, microelectronic element 105 is flip-chip bonded to the reverse surface 103 of sheet 101 by solder balls 142. With respect to microelectronic element 105, an illustrative bond pad for the assembly, bond pad 109, is shown. Since this embodiment illustrates the use of a single-sided metal tape, dielectric 108 includes through-holes or vias for electrically coupling the contacts of microelectronic element 105 to the traces of metallization layer 104. In addition, these through-holes provide access to terminals 120 of FIG. 1. An illustrative hole 144 is shown in FIG. 2. When in an assembled form, the resulting folded stack assembly is mounted to an external circuit via solder balls 143. As described herein, that portion of the unitary sheet having terminals for connecting to an external circuit is also referred to as the terminal portion or the terminal panel of the unitary sheet. In this example, the terminal portion or terminal panel of the unitary sheet is represented by panel 132 of unitary sheet 101.

Although not shown in FIGS. 1 and 2, sheet 101 additionally includes a solder mask layer overlying metallization layer 104. The solder mask layer has corresponding apertures for exposure of the bond pads of sheet 101 for mounting thereto.

The materials and fabrication techniques used to form sheet 101 may be similar to those used to form conventional flexible circuits and conventional flexible mounting tapes such as tape automated bonding ("TAB") tapes. For example, the dielectric layer may include a layer of a flexible but substantially inextensible polymer such as polyimide or BT resin between about 25 and about 100 microns thick, whereas the metallization layer 104 constituting the terminals 120 and the traces may be formed from copper, gold or other metal typically between about 5 and about 25 microns thick. The metallization layer 104 may be provided as a continuous layer, which is etched to form the terminals, traces and bond pads, or else may be provided by selective deposition processes such as selective plating. Other materials and processes of types suitable for manufacture of flexible circuits can be employed. Materials and processes used for forming flexible circuits are discussed in Fjelstad, *An Engineer's Guide To Flexible Circuit Technology*, Electrochemical Publications Ltd. (1997), the disclosure of which is hereby incorporated by reference herein.

The assembly desirably is fabricated in the flat or unfolded condition shown in FIGS. 1 and 2. Thus, the chips may be mounted to the sheet and connected to the traces using conventional bonding equipment and processes. The assembly is tested while still in the flat condition. In a test procedure, the terminals 120 may be engaged with a test fixture (not shown) and the assembly may be operated by signals supplied through the test fixture. As a result of the test, defective chips may be removed and replaced and defective bonds may be repaired. Alternatively, as disclosed in the co-pending, commonly assigned, U.S. Provisional Patent Application Ser. No. 60/409,880, filed Sep. 11, 2002, the disclosure of which is incorporated by reference herein, panels with defective chips may be cut off or disabled.

Although only a single unitary sheet unit 101 is depicted in FIGS. 1 and 2, the sheet unit may be supplied and handled as part of a larger sheet or a continuous or semi-continuous tape. The chips may be attached and connected while the unit remains as part of the larger sheet or tape. After connection of the individual chips and either before or after testing, the unitary sheet unit is cut away from the remainder of the sheet. The unitary shape may be formed at this stage of the manufacturing process.

Figure 3:
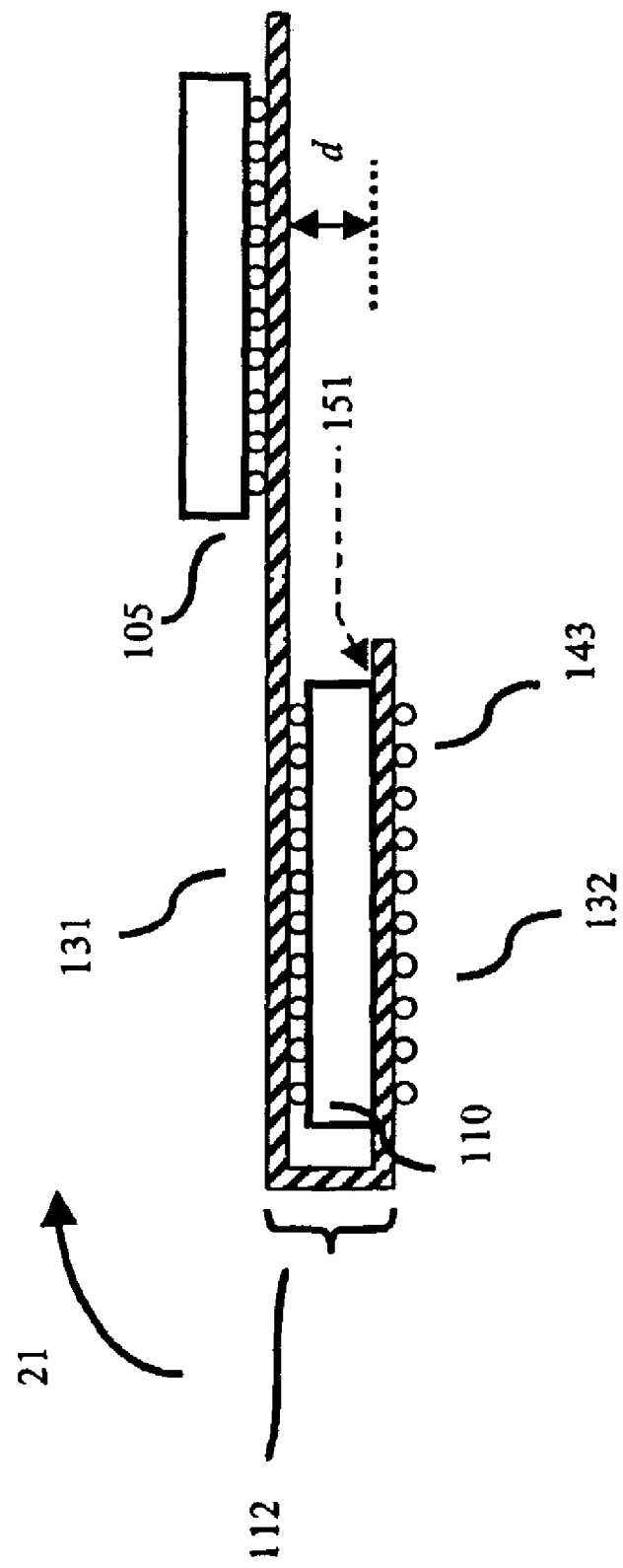
FIGS. 3 and 4 are diagrammatic side views of a stacked microelectronic assembly formed from the component of FIG. 1.
Figure 4:
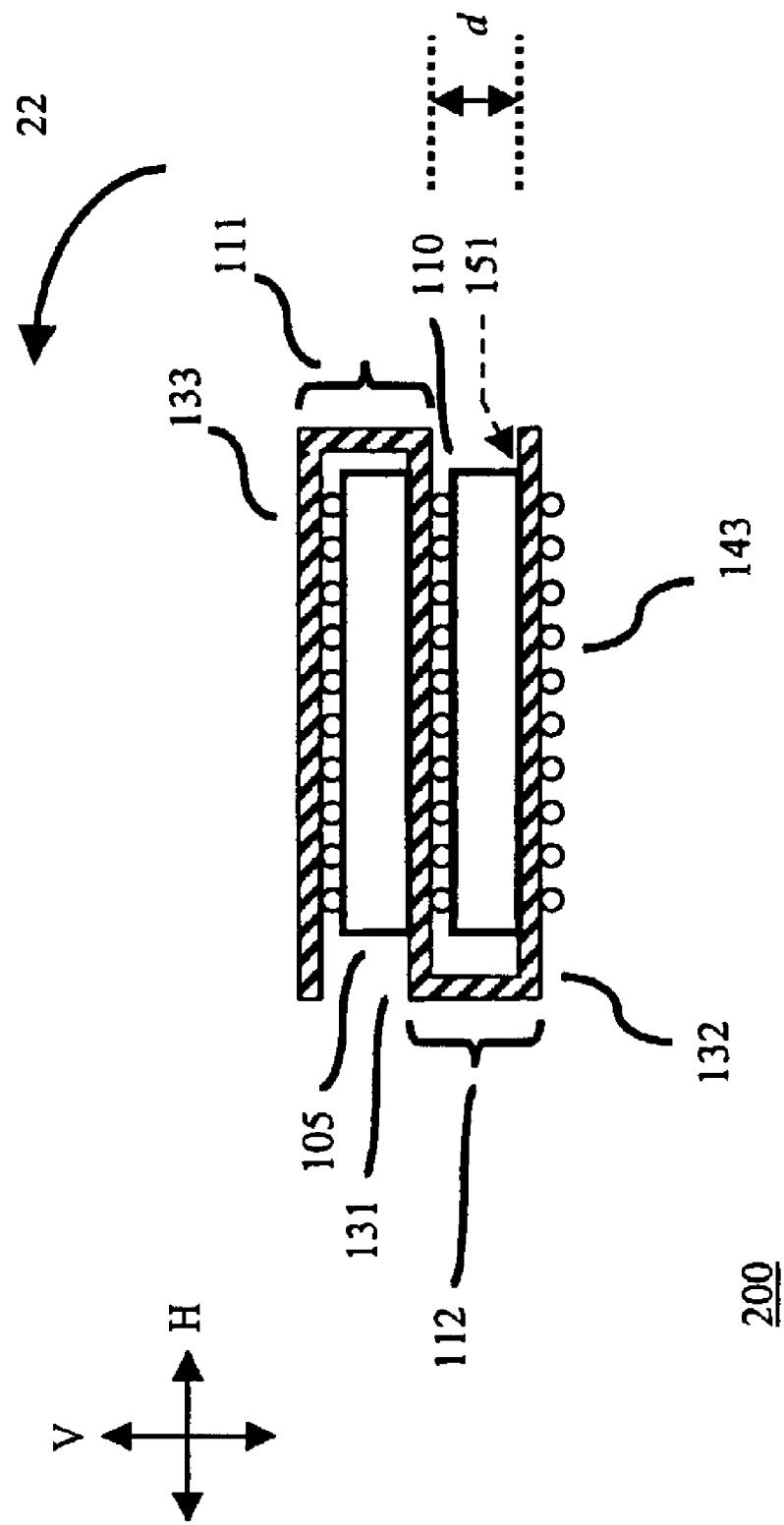

After the flat, generally rectangular unit has been fabricated and assembled, it is folded as illustrated in FIGS. 3 and 4 to form the folded stack assembly. In one folding step, as illustrated first in FIG. 3, the first panel 131 is folded in the direction of arrow 21 by bending the fold region 112 about fold axis 107 so as to form the fold region 112 into a first bight extending upwardly from panel 132 so as to bring the first panel 131 bearing the first microelectronic element 110 into alignment with second panel 132. It should be observed that fold region 112 results in the folding of panel 131 over panel 132 such that the rear face of microelectronic element 110 confronts and abuts the obverse surface of panel 132 as indicated by arrow 151 such that panel 132 is kept substantially flat. As such, the distance, d, between the obverse surface of panel 132 and the obverse surface of that portion of the substrate including panel 131 disposed above panel 132 equals the height of the rear face of microelectronic element 110 above the obverse surface of panel 131. Turning now to FIG. 4, the third panel 133 is folded in the direction of arrow 22 by bending the fold region 111 about fold axis 106 so as to form the fold region 112 into a second bight extending upwardly from first panel 131 so as to bring the third panel 133 bearing the second microelectronic element 105 into alignment with the first panel 131 and the second panel 132, thus resulting in stacked microelectronic assembly 200. Although not required, the fold region 111 results in the rear face of microelectronic element 105 abutting or substantially contacting the reverse surface of panel 131.

Figure 5:
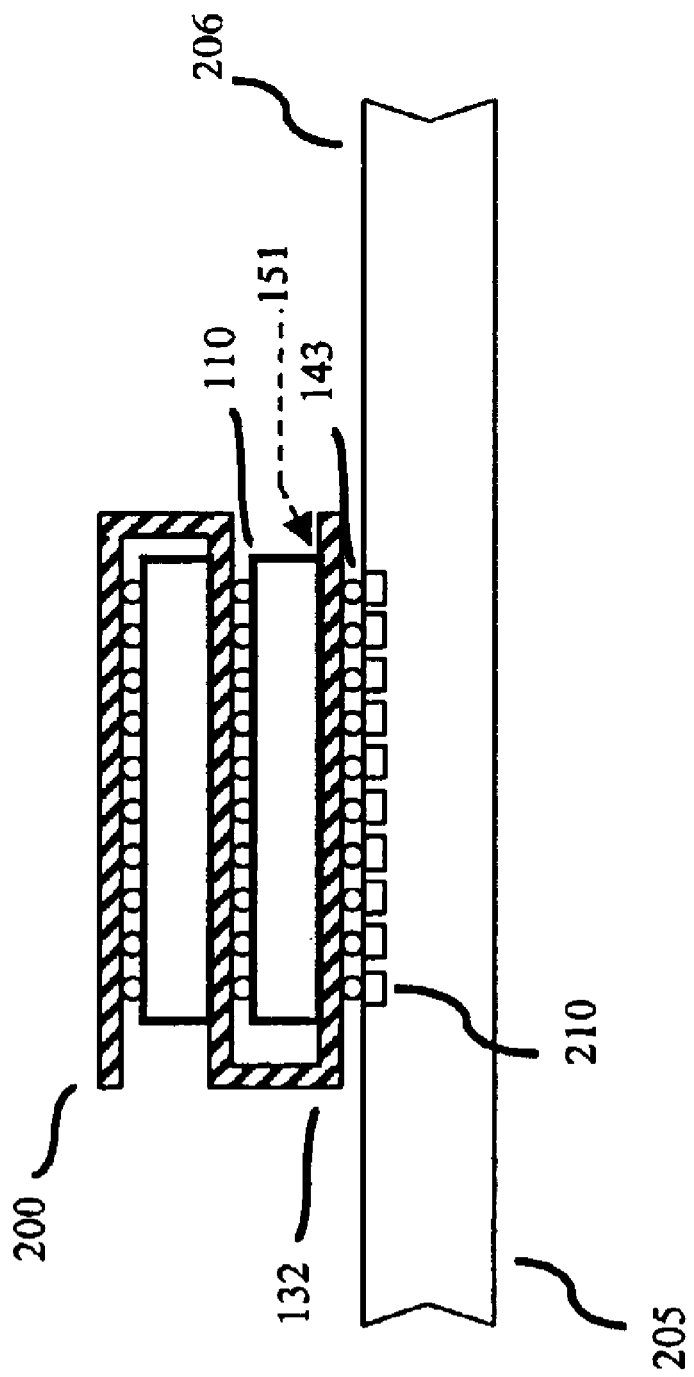
FIG. 5 is a diagrammatic side view of the stacked microelectronic assembly mounted to an external circuit.

As can be observed from FIG. 4, the microelectronic elements are stacked one above the other and are at least partially aligned with one another in horizontal directions indicated by arrows H in FIG. 4. Illustratively, the second or terminal panel 132 of the stacked microelectronic assembly 200 is disposed at the bottom of the stack, leaving solder balls 143 exposed for mounting to an external circuit such as a conventional circuit board or other circuit panel (which itself may be further mounted to another circuit panel). An illustrative portion 205 of an external circuit is shown in FIG. 5. Portion 205 includes a top surface 206 having bonding pads, or contact pads, 210 for mounting thereto microelectronic devices. The stacked microelectronic assembly 200 is positioned over the bonding pads 210 so that the solder balls 143 contact the bonding pads 210. Upon reflow, the stacked microelectronic assembly is attached, or mounted, to the external circuit. Advantageously, and in accordance with an aspect of the invention, terminal panel 132 is kept substantially flat during reflow by the rear face of microelectronic element 110 abutting or substantially contacting the obverse surface of terminal panel 132 as indicated by arrow 151, thus substantially mitigating, if not eliminating, any bubbling of terminal panel 151 during reflow.

As noted above, microelectronic element 110 is a non-overmolded die. As such, the rear face of microelectronic element 110 itself is substantially flat. However, other microelectronic packaging may also be used in folded stacked packages in accordance with the principles of the invention so long as the rear face is substantially planar so that when the rear face confronts the obverse surface of the terminal panel, the terminal panel is kept substantially flat during a subsequent reflow operation when mounting the stacked assembly to an external circuit. Desirably, the rear face of the first microelectronic element is planar to within about 10 microns or less.

The above-described stacked microelectronic assembly 200 is merely illustrative. For example, although the fold regions 111 and 112 are shown as extending substantially in the vertical direction V of FIG. 4, this is not required. A fold region may have a constant radius of curvature or a progressively varying radius of curvature. The only requirement is that the manner of the fold region 112 result in the rear face of the microelectronic element adjacent the terminal panel closely confront the obverse surface of the terminal panel.

Figure 6:
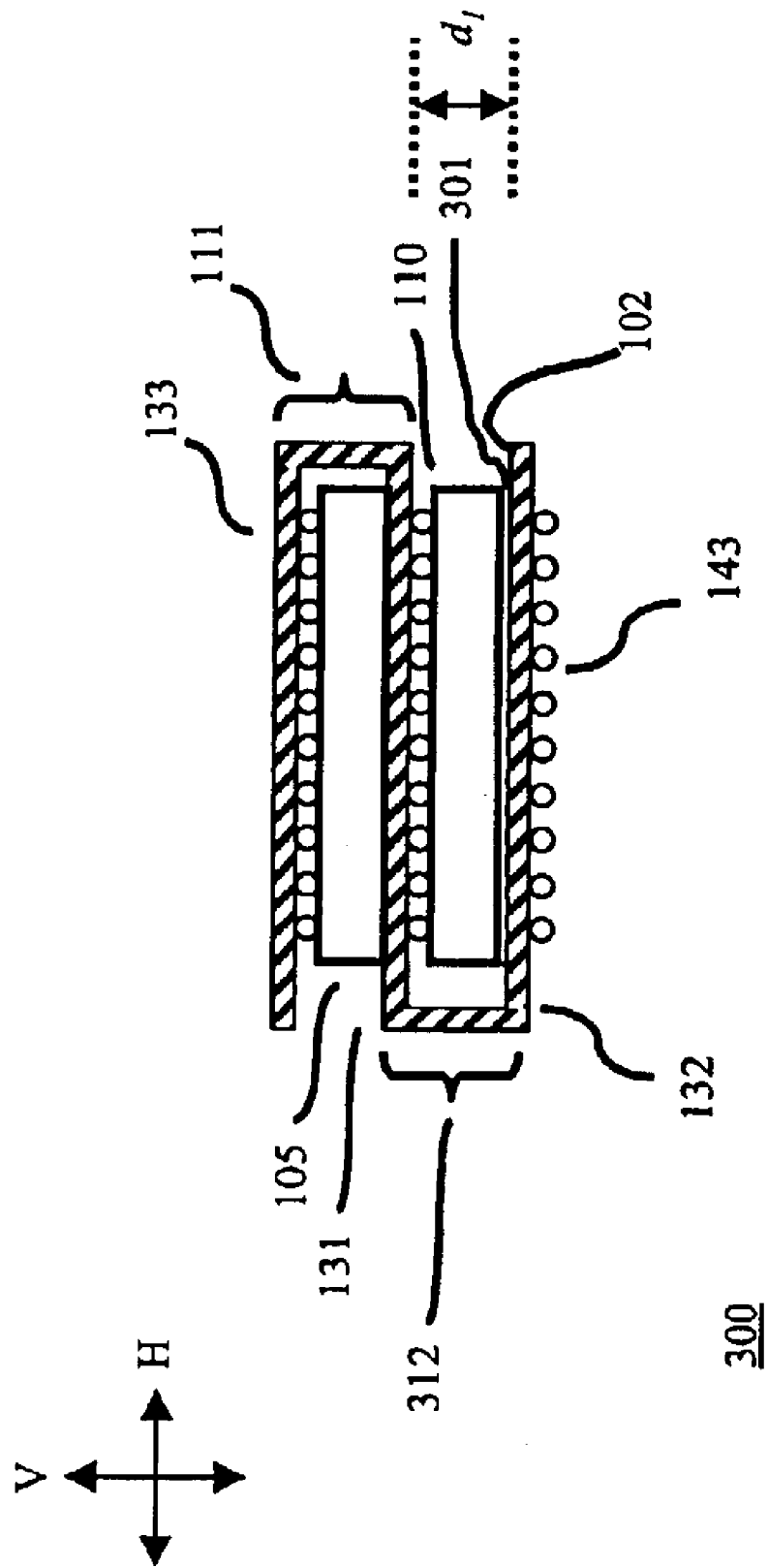
FIG. 6 is a diagrammatic side view of another stacked microelectronic assembly according to another embodiment of the invention.

Another variation is shown in FIG. 6. The stacked microelectronic assembly 300 is similar to the stacked microelectronic assembly 200 of FIG. 4. In the stacked microelectronic assembly 300, a die attach adhesive layer 301 is provided between the obverse surface 102 of the second panel 132 and the rear face of first microelectronic element 110. Preferably, this is a very thin layer of conventional adhesive. Upon folding of fold region 312, the rear face of microelectronic element 110 abuts the die adhesive layer 301 and, therefore, does not directly abut the obverse surface of the second panel. Nonetheless, the rear face of the first microelectronic element lies close enough to the obverse face of the second panel so that the second panel substantially conforms to the planar rear face of the microelectronic element. Desirably, the sum of (1) the maximum non-planarity of the rear face and (2) the maximum deviation from uniform thickness of the die attach layer is less than about 20 microns, and more preferably less than about 10 microns. The term "closely confronting" as used in this disclosure means that the obverse surface of the second panel either directly abuts the rear face of the first microelectronic element or that the aforementioned sum is less than about 20 microns.

The distance, $d_1$, between the obverse surface of panel 131 and the obverse surface of panel 132 equals the height of the rear face of microelectronic element 110 above the obverse surface of panel 131 plus the thickness of the die attach layer. In this regard, fold region 312 must accommodate the additional increase in distance ($d_1$–d).

Figure 7:
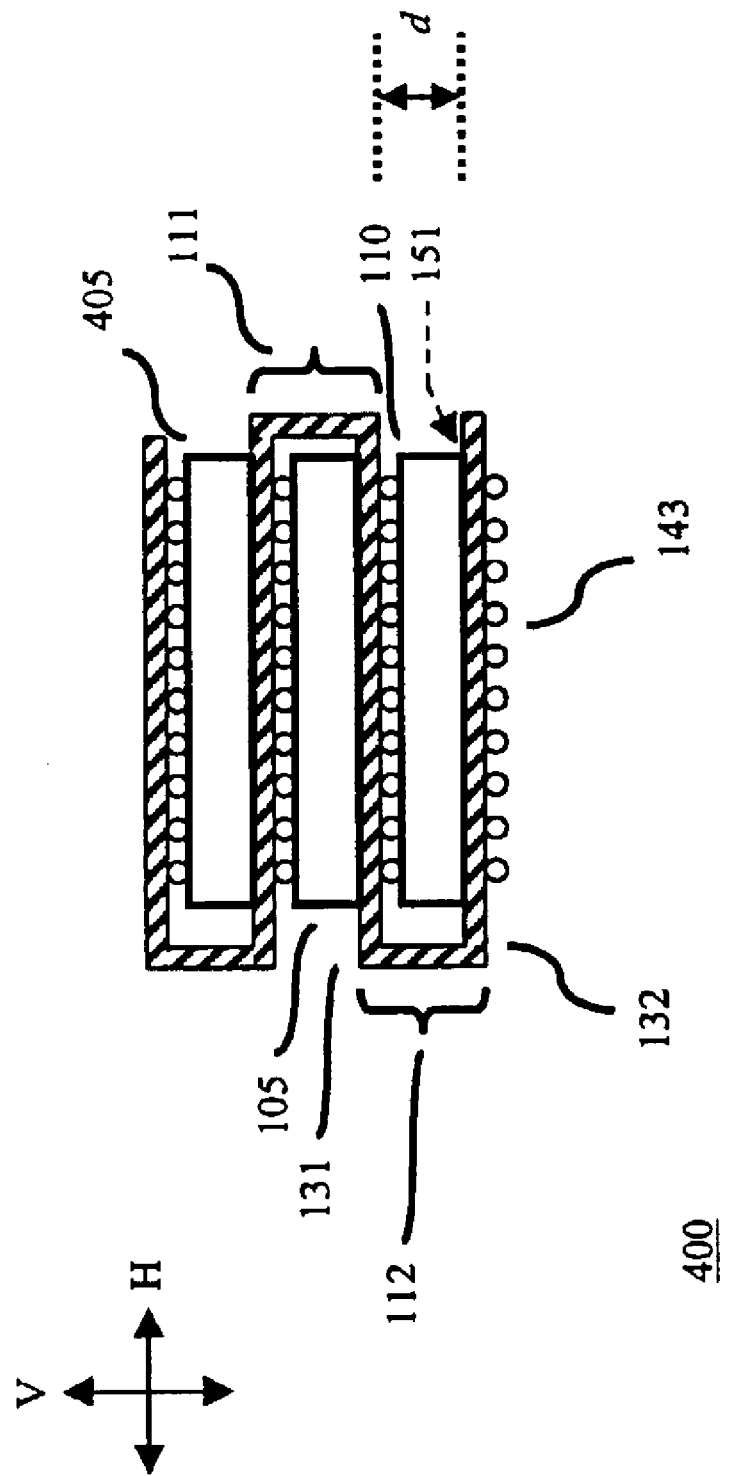
FIG. 7 is a diagrammatic side view of another stacked microelectronic assembly according to another embodiment of the invention.

Although the inventive concept was illustrated in the context of a folded stack having only two layers, i.e., two microelectronic elements stacked one above the other, folded stacks in accordance with the principles of the invention may include more that two layers. This is illustrated in FIG. 7, which shows a folded stack assembly 400 having three layers, i.e., microelectronic elements 405, 105 and 110 stacked one above the other.

Figure 8:
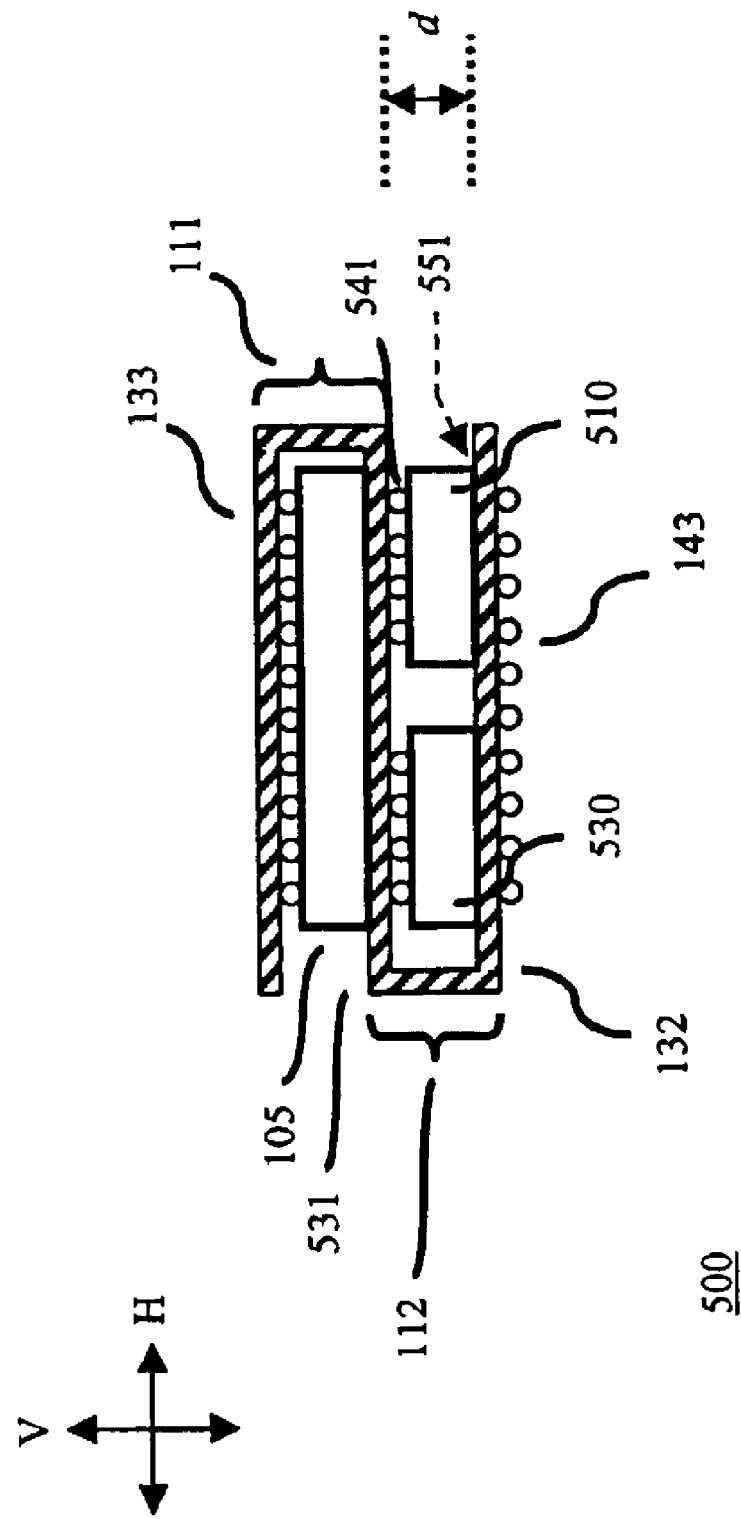
FIG. 8 is a diagrammatic side view of another stacked microelectronic assembly according to another embodiment of the invention.

Further, there may be more than one microelectronic element on one, or more, of the layers. This is illustrated in FIG. 8, which shows a folded stack assembly 500 where first panel 531 has mounted thereon two microelectronic elements 510 and 530. Both microelectronic elements 510 and 530 are mounted to panel 531 via solder balls 541 such that the front face of each element confronts the obverse surface of panel 531. In accordance with an aspect of the invention, the rear faces of microelectronic elements 510 and 530 abut or substantially contact the obverse surface of terminal panel 132 as indicated by arrow 551 such that panel 132 is kept substantially flat. In other words, both rear faces closely confront the obverse surface of terminal panel 132, thus keeping panel 132 flat.

Although not shown in any of the illustrative stacked assemblies described herein, other adhesive layers may be disposed between the rear of each microelectronic element and the surface of the panel below it so that the assembly is retained in the folded position.

In addition, compliant layers may be used in the flexible stack assemblies described above. A compliant layer helps to assure that terminals on, e.g., the terminal panel, are movable in response to differential thermal expansion.

Although the above-described embodiments were described with respect to a single layer unitary sheet (i.e., one metallization layers), the inventive concept is also applicable to a multi-layer unitary sheet (i.e., having two or more metallization layers). Similarly, the metallization layer can be formed from a continuous layer or from selective plating, etc., as described earlier. Further, it should be noted that the microelectronic elements may include active semiconductor elements or a substantially flat package comprising integrated passives on a chip (an IPOC). As such, the microelectronic elements of the above-described folded stacks may be substantially identical to one another, e.g., a stack of memory chips. Also, the electrical connections between the microelectronic element and the traces can be made by structures other than the solder connections discussed above. For example, leads formed integrally with the traces or wire bonds can be used.

In addition, although described in the context of a serpentine folded stack, the inventive concept is also applicable to the side-panel type folded stack assembly described in the above-mentioned co-pending, commonly assigned, U.S. patent application Ser. No. 10/077,388, filed Feb. 15, 2002, the disclosure of which has been incorporated by reference herein.

It should be noted that it is further possible to introduce features to a chip assembly to control folding by, e.g., a molding process, as described in the co-pending, and commonly assigned, U.S. patent application Ser. No. 60/236,395, filed Aug. 16, 2002 and entitled "One-side Folding Methodology for Folded Stack Packages," which is hereby incorporated by reference.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A stacked microelectronic assembly comprising:
    a flexible sheet having oppositely-directed obverse and reverse surfaces, the sheet including at least a first panel and a second panel and having a folding portion connecting the first panel and the second panel to each other;
    terminals exposed at the reverse surface of the second panel for mounting the sheet to an external circuit;
    at least a first microelectronic element having a front face and an opposite rear face, said first microelectronic element being mounted on the obverse surface of the first panel wherein the front face surface confronts the obverse surface of the sheet so that when folded to form a stack a substantial area of the rear face of the first microelectronic element closely confronts the obverse surface of the second panel, the rear face directly abutting or only a layer of dielectric adhesive being between the rear face and the obverse surface of the second panel such that a distance between the rear face of the first microelectronic element and the obverse surface of the second panel is less than about 20 microns whereby the second panel is kept substantially flat; and
    one or more wiring layers including traces extending along the sheet between the panels by way of the folded portion, at least some of the traces electrically connecting the first microelectronic element to at least some of the terminals.

2. A stacked microelectronic assembly as claimed in claim 1, wherein the first microelectronic element is a non-overmolded bare die.

3. A stacked microelectronic assembly as claimed in claim 1, wherein the sheet further includes at least one additional panel such that the first panel is between the one additional panel and the second panel, the at least one additional panel having at least one microelectronic element mounted thereon and wherein the sheet is folded such that the stacked microelectronic assembly is a serpentine folded stack with the at least one additional panel arranged above the first microelectronic element of the first panel.

4. A stacked microelectronic assembly as claimed in claim 3, wherein the first microelectronic element and the at least one microelectronic element are substantially identical to one another.

5. A stacked microelectronic assembly as claimed in claim 3, wherein the first microelectronic element and the at least one microelectronic element are memory chips.

6. A stacked microelectronic assembly as claimed in claim 1, wherein the first panel and the second panel are generally rectangular.

7. A stacked microelectronic assembly as claimed in claim 1, wherein the second panel is disposed at a top or bottom of the stack.

8. A stacked microelectronic assembly as claimed in claim 1, wherein the terminals on the second panel are movable with respect to the contacting first microelectronic element.

9. A stacked microelectronic assembly as claimed in claim 1, wherein the second panel includes a die attach layer arranged on the obverse surface and the rear face of the first microelectronic element contacts the die attach layer.

10. A stacked microelectronic assembly comprising:

a flexible sheet having oppositely-directed obverse and reverse surfaces, the sheet including at least a first panel and a second panel and having a folding portion connecting the first panel and the second panel to each other;

terminals exposed at the reverse surface of the second panel for mounting the sheet to an external circuit;

a plurality of first-panel microelectronic elements, each having a front face and an opposite rear face and mounted on the obverse surface of the first panel wherein each front face surface confronts the obverse surface of the sheet so that when folded to form a stack, the rear faces of the first-panel microelectronic elements closely confront the obverse surface of the second panel, the rear face directly abutting or only a layer of dielectric adhesive being between the rear face and the obverse surface of the second panel such that a distance between the rear face of the plurality of first-panel microelectronic elements and the obverse surface of the second panel is less than about 20 microns whereby the second panel is kept substantially flat; and one or more wiring layers including traces extending along the sheet between the panels by way of the folded portion, at least some of the traces electrically connecting the number of microelectronic elements to at least some of the terminals.

11. A stacked microelectronic assembly as claimed in claim 10, wherein each of said microelectronic elements is a non-overmolded bare die.

12. A stacked microelectronic assembly as claimed in claim 10, wherein the sheet further includes at least one additional panel such that the first panel is between the one additional panel and the second panel, the at least one additional panel having at least one additional-panel microelectronic element mounted thereon and wherein the sheet is folded such that the stacked microelectronic assembly is a serpentine folded stack with the at least one additional panel arranged above the first-panel microelectronic elements.

13. A stacked microelectronic assembly as claimed in claim 12, wherein said microelectronic elements are substantially identical to one another.

14. A stacked microelectronic assembly as claimed in claim 13, wherein said microelectronic elements are memory chips.

15. A stacked microelectronic assembly as claimed in claim 10, wherein the first panel and the second panel are generally rectangular.

16. A stacked microelectronic assembly as claimed in claim 10, wherein the second panel is disposed at a top or bottom of the stack.

17. A stacked microelectronic assembly as claimed in claim 10, wherein the terminals on the second panel are movable with respect to the first-panel microelectronic elements.

18. A stacked microelectronic assembly as claimed in claim 10, wherein the second panel includes a die attach layer arranged on the obverse surface and the rear face of each of the number of microelectronic elements contact the die attach layer.

* * * * *